United States Patent
Takahashi et al.

(10) Patent No.: US 8,404,602 B2
(45) Date of Patent: Mar. 26, 2013

(54) PLASMA OXIDATION METHOD AND PLASMA OXIDATION APPARATUS

(75) Inventors: Shuji Takahashi, Kanagawa-ken (JP); Haruo Shindo, Hiratsuka (JP)

(73) Assignees: FUJIFILM Corporation, Tokyo (JP); Tokai University Educational System, Tokyo (JP)

(\*) Notice: Subject to any disclaimer, the term of this patent is extended or adjusted under 35 U.S.C. 154(b) by 0 days.

(21) Appl. No.: 13/085,215

(22) Filed: Apr. 12, 2011

(65) Prior Publication Data

US 2011/0250763 A1 Oct. 13, 2011

(30) Foreign Application Priority Data

Apr. 13, 2010 (JP) ................................. 2010-092291

(51) Int. Cl.
*H01L 21/469* (2006.01)

(52) U.S. Cl. ................. 438/771; 438/788; 257/E21.282

(58) Field of Classification Search .................. 438/771, 438/772; 257/E21.282, E21.283, E21.284, 257/E21.331, E21.471, E21.472

See application file for complete search history.

(56) References Cited

U.S. PATENT DOCUMENTS

| | | |
|---|---|---|
| 2003/0219989 A1 | 11/2003 | Terasaki et al. |
| 2003/0224616 A1 | 12/2003 | Ogawa et al. |
| 2008/0236750 A1\* | 10/2008 | Koshimizu ............... 156/345.38 |

FOREIGN PATENT DOCUMENTS

| | | |
|---|---|---|
| JP | 11-121448 A | 4/1999 |
| JP | 2002-280369 A | 9/2002 |
| JP | 2004-47950 A | 2/2004 |
| JP | 2005-294551 A | 10/2005 |

\* cited by examiner

*Primary Examiner* — Cheung Lee (74) *Attorney, Agent, or Firm* — Birch, Stewart, Kolasch & Birch, LLP (57) ABSTRACT

A plasma oxidation method includes the steps of: generating oxygen-containing plasma with a process gas containing oxygen; applying a bias voltage to a substrate placed on a stage; and radiating positive ions and negative ions in the oxygen-containing plasma onto the substrate so as to perform plasma oxidation of the substrate while controlling a bias potential of the substrate in such a manner that a maximum value Vmax and a minimum value Vmin of the bias potential and a plasma potential Vp satisfy a following relationship: Vmin<Vp<Vmax.

8 Claims, 7 Drawing Sheets

PLASMA OXIDATION METHOD AND PLASMA OXIDATION APPARATUS

BACKGROUND OF THE INVENTION

1. Field of the Invention

The present invention relates to a plasma oxidation method and a plasma oxidation apparatus, and more particularly to a plasma oxidation method and a plasma oxidation apparatus for forming a silicon oxide film by oxidizing silicon through radiating oxygen plasma onto a silicon substrate used in a semiconductor process.

2. Description of the Related Art

In a manufacturing process for a semiconductor apparatus, the process for forming a silicon oxide film on the surface of a silicon substrate by oxidizing the substrate, for example, is important. A method of oxidizing silicon typically employs a thermal oxidation method, but this involves a high processing temperature of 1000° C., and there is a possibility that impurities in the silicon substrate are diffused. Therefore, silicon oxidation methods using plasma oxidation has been proposed.

For example, Japanese Patent Application Publication No. 11-121448 discloses a method of manufacturing a silicon oxide film in which a positive or negative bias voltage is applied to a silicon substrate and the silicon substrate is kept at room temperature in such a manner that plasma oxidation of the surface of the silicon substrate is performed, in order to create an ultra-thin silicon oxide film which displays MOS characteristics, at room temperature.

Furthermore, Japanese Patent Application Publication No. 2005-294551 discloses an oxidation processing method of a silicon processing object, such as a silicon substrate, in which a silicon processing object is exposed to a plasma including oxygen radicals, and anisotropic oxidation is carried out by applying a DC voltage to the substrate, in order to carry out anisotropic oxidation of the silicon processing object at a lower temperature than 1000° C.

Furthermore, Japanese Patent Application Publication No. 2004-47950 discloses a method of manufacturing a semiconductor apparatus in which, in order to form a processed film thickly and uniformly, and inexpensively and at low temperature when performing nitrogen processing or oxidation processing of the surface of a substrate, an oxide film is formed by using a modified magnetron plasma processing apparatus which is capable of controlling the energy of ions injected into the substrate independently of the generation of plasma, supplying a gas including elemental oxygen into a processing chamber, and performing plasma discharge in the gas including elemental oxygen by means of a high-frequency electric field obtained by supplying high-frequency power to a cylindrical electrode and a magnetic field obtained by means of a magnetic field line forming means, so as to oxidize the processing object.

Moreover, Japanese Patent Application Publication No. 2002-280369 discloses an oxide film forming apparatus for a silicon substrate in which, in order to form a silicon oxide film which is compatible with more increased density and finer configuration of integrated circuits, a plasma including oxygen is generated and negative oxygen ions in the generated plasma are radiated onto a silicon substrate.

However, in a silicon oxidation method using plasma oxidation, there are few practical examples of low-temperature processing at 400° C. or below, and when processing has been performed at a low temperature of 400° C. or below, the oxidation rate has been slow and it has been difficult to create a thick oxide film. Furthermore, in a plasma oxidation method using positive ions and negative ions, when one of "positive ions" and "negative ions" is used, due to the occurrence of a charging-up phenomenon, the oxidation rate falls and it is difficult to oxidize a thick film.

For example, according to the method described in Japanese Patent Application Publication No. 11-121448, when oxidizing very thin films such as a semiconductor, the oxidation rate is low, and therefore it is possible to control the film thickness and productivity is not a problem. However, if a positive bias is applied to a silicon substrate, negative ions arrive mainly at the substrate, and if a negative bias is applied, positive ions arrive at the substrate. In this way, according to a method which applies one of a positive bias and a negative bias, in other words, a method applying a DC (direct current) bias, a charging-up phenomenon occurs and it is difficult to form a thick oxide film, and furthermore, there is a problem of poor productivity due to the low oxidation rate.

Moreover, in the method described in Japanese Patent Application Publication No. 2005-294551, anisotropic oxidation is achieved by using ions in such a manner that the upper surface and bottom surface of a projecting shape are oxidized but the side faces are not oxidized. However, if a DC voltage is applied to a substrate, there is a possibility that a charging-up phenomenon may occur due to attraction of one of the positive ions and negative ions. Moreover, due to effects of the charging-up phenomenon, as well as being difficult to form a thick oxide film, the oxidation rate is low and productivity is poor.

Furthermore, according to the method described in Japanese Patent Application Publication No. 2004-47950, the potential of the substrate is controlled by a variable impedance, and oxidation is carried out by controlling the energy of the ions. However, if the substrate potential is controlled by a variable impedance, then it is not possible to control the value of the self-bias voltage Vdc, to a positive potential, and furthermore, the value of Vdc changes simultaneously with the control of the peak-to-peak voltage Vpp. Therefore, since Vdc and Vpp cannot be controlled individually, there are limitations on the range of the oxidation conditions, and consequently, it is difficult to achieve a thick oxide film and to improve the oxidation rate.

Furthermore, according to the method described in Japanese Patent Application Publication No. 2002-280369, oxidation is carried out by irradiating negative ions onto the substrate, and the negative ions are radiated by applying RF (high-frequency wave) and DC (direct current) by transformer-coupling. However, if only negative ions are used, then there are possibilities that it is difficult to achieve a thick film due to the occurrence of a charging-up phenomenon, and the oxidation rate is low. Furthermore, if the peak-to-peak voltage Vpp during oxidation and the self-bias voltage Vdc are too high, then plasma forms in the vicinity of the stage and it is difficult to achieve oxidation which causes little damage. Moreover, in Japanese Patent Application Publication No. 2002-280369, bias application frequencies of 400 kHz and 1 MHz are used, and in the case of the lower frequency, the oxide film becomes a capacitor and it becomes difficult to apply the bias. Therefore, when forming a thick oxide film, it is difficult to obtain the effects of applying the bias, and therefore it is difficult to obtain a thick film.

SUMMARY OF THE INVENTION

The present invention has been contrived in view of these circumstances, an object thereof being to provide a plasma oxidation method and a plasma oxidation apparatus capable of oxidizing a thick film, while also enabling oxidation at low temperature by improving the oxidation rate even in cases where the substrate temperature is low.

In order to attain an object described above, one aspect of the present invention is directed to a plasma oxidation method comprising the steps of: generating oxygen-containing plasma with a process gas containing oxygen; applying a bias voltage to a substrate placed on a stage; and radiating positive ions and negative ions in the oxygen-containing plasma onto the substrate so as to perform plasma oxidation of the substrate while controlling a bias potential of the substrate in such a manner that a maximum value Vmax and a minimum value Vmin of the bias potential and a plasma potential Vp satisfy a following relationship: Vmin<Vp<Vmax.

According to this aspect of the invention, by applying a substrate bias voltage which is controlled to a value where Vmax is greater than Vp, it is possible to draw negative ions in the plasma efficiently to a substrate, and responsiveness is improved. As a result, the plasma oxidation rate can be improved, film quality can be improved, and film formation at low temperature is possible. Furthermore, since Vmin is smaller than Vp, then it is possible to restrict decline in the oxidation rate caused by a charging-up phenomenon. Consequently, even if the substrate temperature is low, it is possible to improve the oxidation rate and oxidation of the substrate at low temperature becomes possible, as well as being able to form a thick oxide film.

For example, at a low substrate temperature of 400° C., for example, it is possible to oxidize a thick film, as well as being able to form a silicon oxide film by oxidizing a silicon substrate and a trench formed in a silicon substrate at high speed.

Desirably, the bias voltage applied to the substrate is controlled by a high-frequency wave application device provided with the stage.

Desirably, the high-frequency wave application device applies a direct-current voltage and a high-frequency voltage by a transformer-coupling system.

According to this aspect of the invention, it is possible to control the peak-to-peak voltage Vpp and the self-bias voltage Vdc of the substrate bias voltage independently.

Desirably, the stage is positioned in a region where a floating potential during the plasma oxidation of the substrate is equal to or greater than 0 V.

According to this aspect of the invention, it is possible to make a large amount of negative ions present on a substrate which is placed on the stage.

Desirably, the maximum value Vmax of the bias potential of the substrate and the plasma potential Vp satisfy a following relationship: Vmax<Vp+30 [V].

According to this aspect of the invention, it is possible to draw negative ions in the plasma to the substrate, with good efficiency, and therefore the plasma oxidation rate can be improved, film quality can be improved and film formation at low temperature becomes possible.

Desirably, when a temperature of the substrate is 200° C. or lower, the minimum value Vmin of the bias potential of the substrate and the plasma potential Vp satisfy a following relationship: Vmin<Vp−5 [V].

According to this aspect of the invention, it is possible to suppress decline in the oxidation rate due to a charging-up phenomenon.

Desirably, the substrate oxidized by the plasma oxidation is made of silicon or aluminum.

In order to attain an object described above, another aspect of the present invention is directed to a plasma oxidation apparatus comprising: a plasma generating unit which generates oxygen-containing plasma; a stage on which a substrate is placed; and a high-frequency wave application device which applies a bias voltage to the substrate on the stage, wherein the plasma oxidation apparatus performs plasma oxidation of the substrate while applying the bias voltage to the substrate, the plasma oxidation being performed by radiating positive ions and negative ions in the oxygen-containing plasma onto the substrate so as to perform the plasma oxidation of the substrate while controlling a bias potential of the substrate in such a manner that a maximum value Vmax and a minimum value Vmin of the bias potential and a plasma potential Vp satisfy a following relationship: Vmin<Vp<Vmax.

According to this aspect of the invention, by applying a substrate bias voltage which is controlled to a value where Vmax is greater than Vp, then it is possible to draw negative ions in the plasma efficiently to a substrate, and responsiveness is improved. As a result, the plasma oxidation rate can be improved, film quality can be improved, and film formation at low temperature is possible. Furthermore, since Vmin is smaller than Vp, then it is possible to restrict decline in the oxidation rate caused by a charging-up phenomenon. Consequently, even if the substrate temperature is low, it is possible to improve the oxidation rate and oxidation of the substrate at low temperature becomes possible, as well as being able to form a thick oxide film.

Desirably, the high-frequency wave application device applies a direct-current voltage and a high-frequency voltage by a transformer-coupling system.

According to this aspect of the invention, it is possible to control the peak-to-peak voltage Vpp and the self-bias voltage Vdc of the substrate bias voltage independently.

Desirably, the stage is positioned in a region where a floating potential during the plasma oxidation of the substrate is equal to or greater than 0 V.

According to this aspect of the invention, it is possible to make a large amount of negative ions present on a substrate which is placed on the stage.

Desirably, the maximum value Vmax of the bias potential of the substrate and the plasma potential Vp satisfy a following relationship: Vmax<Vp+30 [V].

According to this aspect of the invention, it is possible to draw negative ions in the plasma to the substrate, with good efficiency, and therefore the plasma oxidation rate can be improved, film quality can be improved and film formation at low temperature becomes possible.

Desirably, when a temperature of the substrate is 200° C. or lower, the minimum value Vmin of the bias potential of the substrate and the plasma potential Vp satisfy a following relationship: Vmin<Vp−5 [V].

According to this aspect of the invention, it is possible to suppress decline in the oxidation rate due to a charging-up phenomenon.

According to the present invention, since a substrate bias voltage in which Vmax is controlled to a value greater than Vp is applied, then it is possible to draw negative ions in the plasma into the substrate, efficiently, and hence responsiveness is improved, the plasma oxidation rate is improved, the film quality is improved and film formation at low temperature is also possible. Furthermore, since Vmin is smaller than Vp, then it is possible to restrict decline in the oxidation rate caused by a charging-up phenomenon. Consequently, even if the substrate temperature is low, it is possible to improve the oxidation rate and oxidation at low temperature becomes possible, as well as being able to form a thick oxide film.

BRIEF DESCRIPTION OF THE DRAWINGS

A preferred embodiment of this invention as well as other objects and benefits thereof, will be explained in the following with reference to the accompanying drawings, in which like reference characters designate the same or similar parts throughout the figures and wherein:

FIGS. 6A to 6C are graphs showing measurement results for the oxide film thickness in FIG. 5 when the values of Vpp and Vdc are converted to values of Vmax and Vmin: in FIGS. 6A and 6B, the horizontal axis represents Vmin and the vertical axis represents the oxide film thickness, and in FIG. 6C, the horizontal axis represents Vmax and the vertical axis represents the oxide film thickness;

FIGS. 8A to 8C are graphs showing measurement results for the oxide film thickness in FIG. 7 when the values of Vpp and Vdc are converted to values of Vmax and Vmin: in FIGS. 8A and 8B, the horizontal axis represents Vmax and the vertical axis represents the oxide film thickness, data being shown for respective values of Vmin, and in FIG. 8C, the horizontal axis represents Vmin and the vertical axis represents the oxide film thickness.

DESCRIPTION OF THE PREFERRED EMBODIMENTS

Figure 1:
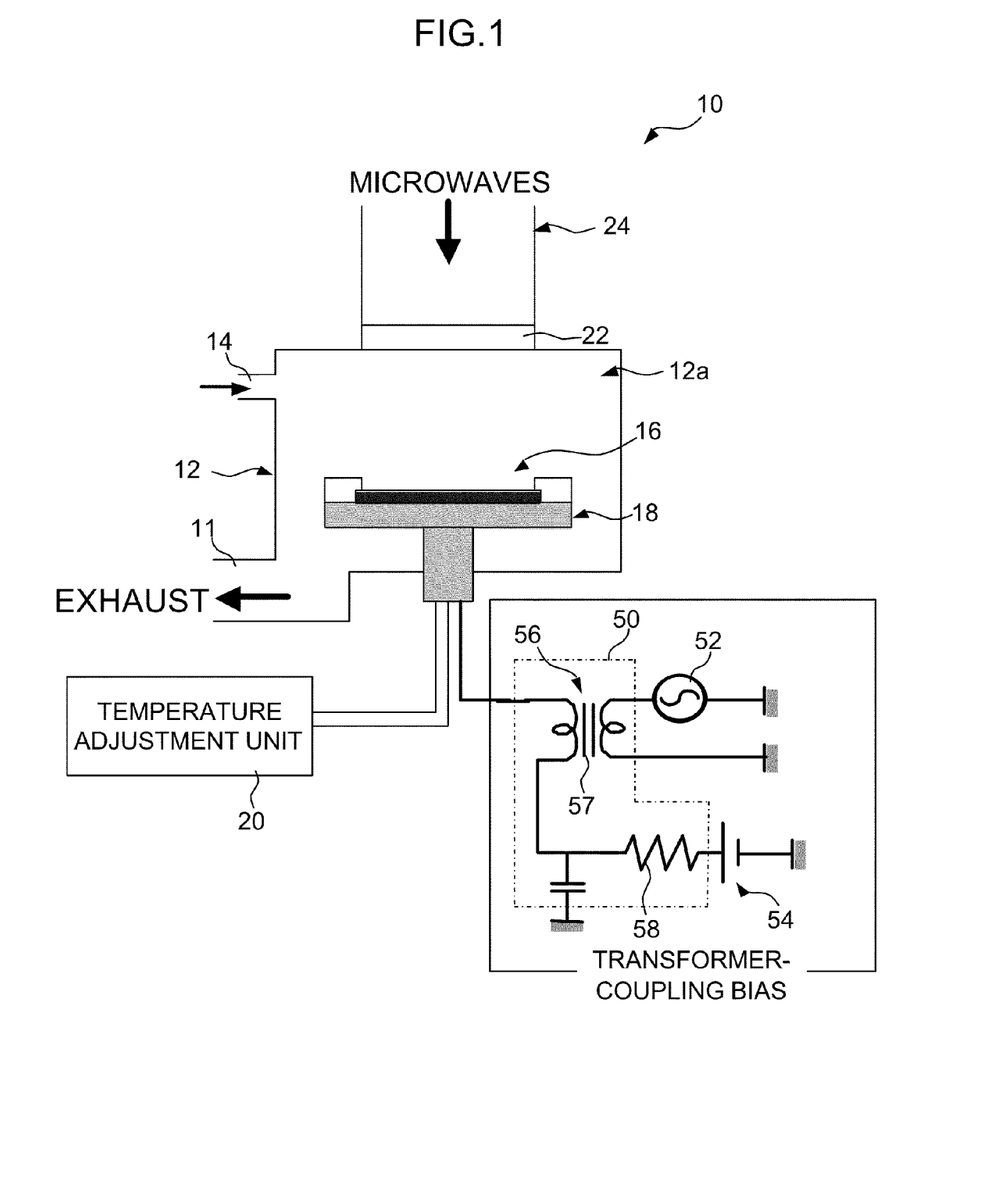
FIG. 1 is a cross-sectional drawing showing the composition of a plasma oxidation apparatus relating to one embodiment of the present invention.

FIG. 1 is a cross-sectional drawing showing the composition of a plasma oxidation apparatus relating to one embodiment of the present invention.

As shown in FIG. 1, this plasma oxidation apparatus 10 comprises a vacuum chamber 12 (vacuum vessel); a process gas introduction section 14 is provided in the upper part of the vacuum chamber 12 and a process gas for producing plasma is introduced via this introduction section 14. Although not shown in the drawings, a mass flow controller (MFC) is provided with the process gas introduction section 14 in such a manner that process gas is supplied to the interior of the vacuum chamber 12 while the flow volume of the process gas is controlled.

Furthermore, an exhaust section 11 comprising an exhaust pump (not illustrated), and a pressure adjustment mechanism (not illustrated), are connected to the vacuum chamber 12, and the gas flow volume and the processing pressure used in the plasma oxidation processing can be adjusted by means of these.

Moreover, a stage 18 for holding and fixing a substrate 16 which is a processing object is disposed in the bottom portion of the interior of the vacuum chamber 12. A heater (not illustrated) for controlling the stage temperature is provided inside the stage 18 in such a manner that the stage temperature can be controlled by the temperature adjustment section 20. The substrate 16 which forms a processing object may be made of silicon or aluminum, for example, but is not limited to these.

Furthermore, in order to control the substrate bias voltage applied to the substrate 16, a high-frequency power source 52 (bias high-frequency power source) and a DC power source 54 (bias DC power source) are provided in series via a transformer-coupling type of matching box 50 with the stage 18, as a high-frequency application device (means).

As shown in FIG. 1, a high-frequency power source 52 is connected to the primary side winding wire wound about a core 57 of a transformer 56, and the DC power source 54 is connected to the secondary side winding wire via a resistor 58. By means of a composition of this kind, a substrate bias voltage formed by the superimposed high-frequency voltage and DC voltage is applied to the substrate 16 on the stage 18 from the high-frequency power source 52 and the DC power source 54 via the transformer 56.

Furthermore, a microwave introduction section 24 connected to a microwave generating source (not illustrated) is provided on the upper surface of the vacuum chamber 12 via a dielectric window (microwave introduction window) 22. The microwave generating source comprises a magnetron, for example, and generates microwaves at 2.45 GHz. The frequency of the microwaves should be selected in the range of 0.8 to 20 GHz.

The microwaves are converted into TM mode or TE mode, or the like, by a mode converter (not illustrated), and are propagated through a waveguide tube (also not illustrated). Furthermore, although not illustrated in the drawings, an isolator or impedance matching box, or the like, is provided in the waveguide path of the microwaves.

The isolator prevents reflected microwaves from returning to the microwave generating source and absorbs such reflection.

Furthermore, the impedance matching box has a power meter which identifies the respective intensities and phases of the traveling wave which is supplied to the load from the microwave generating source and the reflected wave which is reflected by the load and seeks to return to the microwave generating source. The impedance matching box has a function of matching between the microwave generating source and the load side, and includes a stub tuner, or the like.

For the gas used for the process gas, a gas including oxygen, such as $O_2$, $O_3$, $H_2O$, $N_2O$, or the like, can be used. Furthermore, it is also possible to use a mixed gas which combines an oxygen-containing gas and an inert gas, such as Ar, $N_2$, He, Kr or Xe, as the process gas. The process gas is supplied at a prescribed flow rate to the interior of the vacuum chamber 12, and the pressure inside the vacuum chamber 12 is adjusted by a pressure adjustment mechanism (not illustrated). Furthermore, although not illustrated in the drawings, a vacuum exhaust mechanism, such as a turbo pump or a dry pump, is provided after the pressure adjustment mechanism.

Moreover, the dielectric window 22 transmits the microwaves supplied from the microwave generating source (not illustrated) to the interior of the vacuum chamber 12, while also functioning as a partition wall of the vacuum chamber 12. For the dielectric window 22, it is possible to use quartz, alumina, alumina nitride, or the like, for example.

Furthermore, the substrate 16 is fixed to the stage 18, and is accommodated and installed inside the vacuum chamber 12. Although not shown in the drawings, it is possible to transmit the temperature of the stage to the substrate 16 efficiently, by fixing the substrate 16 to the stage 18 by means of a clamp mechanism or electrostatic chuck mechanism for fixing the substrate 16.

A temperature adjustment unit 20 controls the stage temperature via a heater which is built into the stage 18. The stage temperature is controlled to 200 to 400° C. If the stage temperature is controlled to be 200° C. or below, then a heater and a flow channel for passing a temperature regulating liquid are built into the stage 18, and the temperature of the stage 18 is adjusted by being connected to a chiller which controls the temperature of the temperature regulating liquid. Furthermore, in order to control the stage temperature, a temperature gauge (not illustrated) is provided with the stage 18 and the temperature is controlled by the temperature adjustment unit 20 in such a manner that the stage 18 assumes a prescribed temperature.

The bias high-frequency power source is desirably a low-frequency power source, and for example, a low-frequency power source in the range of 100 (kHz) to 4 (MHz) is desirable. The output waveform of the high-frequency power source is not limited to a sinusoidal waveform, and may be a square wave or triangular wave, or the like.

The output from the high-frequency power source and the output from the DC power source are controlled by a control circuit, which is not illustrated, and each of their outputs can be adjusted suitably. By adjusting the output of the high-frequency power source, it is possible to set the value of the peak-to-peak voltage (peak-to-peak potential difference) Vpp of the substrate bias voltage to a desired value.

By adjusting the output of the DC power source, it is possible to set the value of the self-bias voltage Vdc of the substrate bias voltage to a desired value.

In this way, in a plasma oxidation apparatus (dry etching apparatus) which uses a high-density plasma, by employing a bias application device (high-frequency application device) of a transformer-coupling type which uses combination of a high-frequency power source and a DC power source in the substrate bias application unit, then it is possible to control the peak-to-peak voltage Vpp of the substrate bias voltage and the self-bias voltage Vdc, respectively and independently. Therefore, it is possible to apply a substrate bias voltage which has a Vmax value equal to or greater than Vp, and hence a positive bias can be applied to the substrate 16.

By means of the composition described above, plasma oxidation of the substrate 16 is carried out in a downstream region of a high-density plasma.

Figure 2:
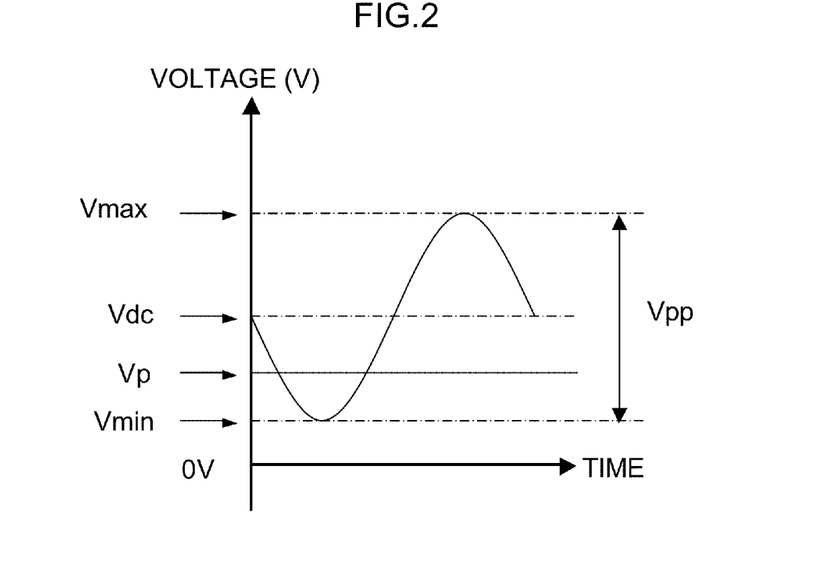
FIG. 2 is a graph showing one example of the voltage waveform of a substrate bias applied to a substrate on a stage.

FIG. 2 is a graph showing one example of the voltage waveform of a substrate bias applied to a substrate 16 on the stage 18. FIG. 2 plots time on the horizontal axis and voltage on the vertical axis, and Vmax represents the maximum value of the voltage waveform and Vmin represents the minimum value of the voltage waveform. Furthermore, Vp represents the plasma potential.

As shown in FIG. 2, by applying Vdc, the whole waveform is made positive and the relationship Vmin<Vp<Vmax is established. If the potential is greater than Vp, then negative ions are radiated onto the substrate 16 and if the potential is smaller than Vp, then positive ions are radiated onto the substrate 16.

As shown in FIG. 2, by applying a substrate bias voltage in which Vmax is controlled to a value equal to or greater than Vp, in particular, it is possible to draw negative ions in the plasma into the substrate, efficiently, and hence responsiveness is improved, the plasma oxidation rate is raised, the film quality is improved and film formation at low temperature is also possible. Furthermore, since Vmin is equal to or less than Vp, then it is possible to suppress reduction in the oxidation rate due to a charging-up phenomenon. These are described in more detail below.

Below, a method of forming an oxide film (insulating film) by carrying out plasma oxidation of a silicon substrate using the plasma oxidation apparatus 10 illustrated in FIG. 1 will be described.

Firstly, the surface of a silicon substrate is cleaned using a commonly known cleaning method. For example, removal of organic material/metal/particles is performed in an RCA clean, and cleaning with buffered hydrofluoric acid is carried out to remove the natural oxide film on the surface of the silicon substrate. The silicon substrate (substrate 16) is then placed on the stage 18.

Next, process gas is introduced into the vacuum chamber 12 from the process gas introduction section 14. As stated previously, the process gas used should be a gas containing oxygen, and may be $O_2$, $O_3$, $H_2O$, $N_2O$, or the like. Furthermore, it is also possible to use a mixed gas which includes an oxygen-containing gas and an inert gas, such as Ar, $N_2$, He, Kr or Xe. In this example case, oxygen gas was used and the flow rate was set to 500 sccm.

A desirable range for the pressure inside the vacuum chamber 12 (the degree of vacuum when introducing gas) is 1 to 100 Pa. In this case, the pressure was set to 6.6 Pa. Furthermore, the microwave output should be 50 to 5000 W, and in this case the output was 500 W.

The substrate bias should use a high-frequency wave of 100 kHz to 4 MHz, via the transformer-coupling type matching box 50, and in implementing the present experiment, the frequency was set to substantially 2 MHz.

Here, the frequency of the high-frequency wave applied to the substrate bias is required to be equal to or less than the ion plasma frequency of the negative oxygen ions. This is because, if the frequency applied to the bias is higher than the ion plasma frequency, then the ions cannot follow, and therefore if the frequency applied to the bias is higher than the ion plasma frequency of the negative oxygen ions, it is not possible to irradiate the negative oxygen ions.

More specifically, the ion plasma frequency $f_i$ can be determined by Formula (1) and Formula (2) below.

$$\omega_{pi} = \sqrt{\frac{e^2 n_e}{\varepsilon_0 m_i}} \quad \text{Expression 1}$$

$$f_i = \frac{\omega_{pi}}{2\pi} \quad \text{Expression 2}$$

Here, $\omega_{pi}$; represents the ion plasma angular frequency, e represents the charge, $n_e$ represents the electron density, $\varepsilon_0$ represents the permittivity of a vacuum, and $m_i$ represents the mass of ions. The ion plasma frequency $f_i$ is determined from Formula (2) using the ion plasma angular frequency $\omega_{pi}$, determined by Formula (1) above.

Considering that oxidation is to be continued after forming the initial oxide film, a higher applied frequency is desirable. This is because the formed oxide film acts as a capacitor. Therefore, in this example case, the frequency was set to substantially 2 MHz, as stated previously.

Figure 3:
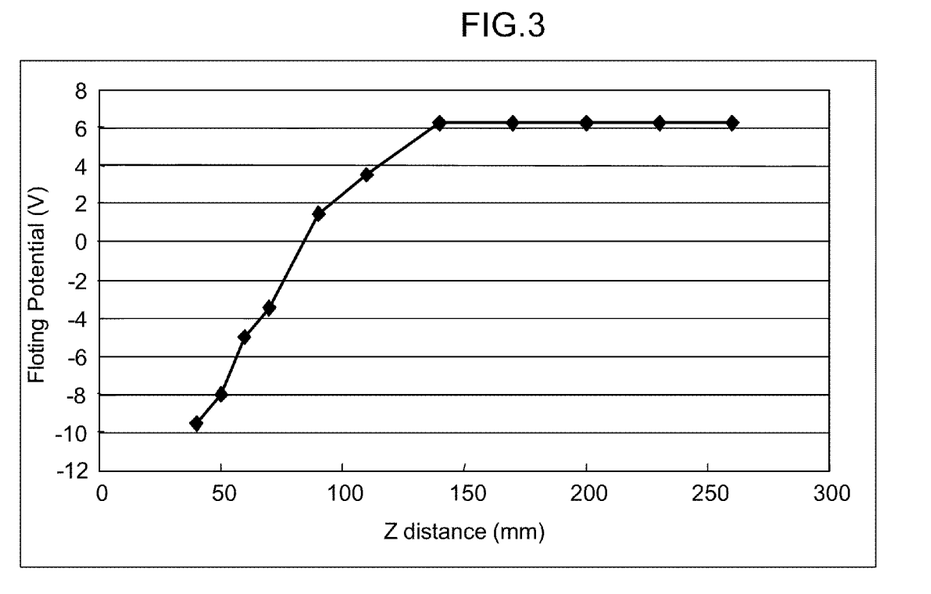
FIG. 3 is a graph showing measurement results of the floating potential Vf at a distance Z from a dielectric window.

FIG. 3 shows a graph of the measurement results of the floating potential Vf at respective distances Z [mm] from the dielectric window 22, under the conditions described above.

A commercial Langmuir probe may be used for measurement. From FIG. 3, it can be seen that when the distance Z from the dielectric window 22 is 150 mm or above, the floating potential Vf is a uniform value of approximately 6 V. This indicates the down flow region and the position of the stage 18 is desirably not less than 150 mm from the dielectric window 22. For this reason, in this example case, the position of the stage 18 was set to a distance of 200 mm from the dielectric window 22.

The floating potential Vf is desirably not less than 0 V in such a manner that the position of the stage 18 is one where a large number of negative ions are present inside the down flow region on the stage 18.

Figure 4:
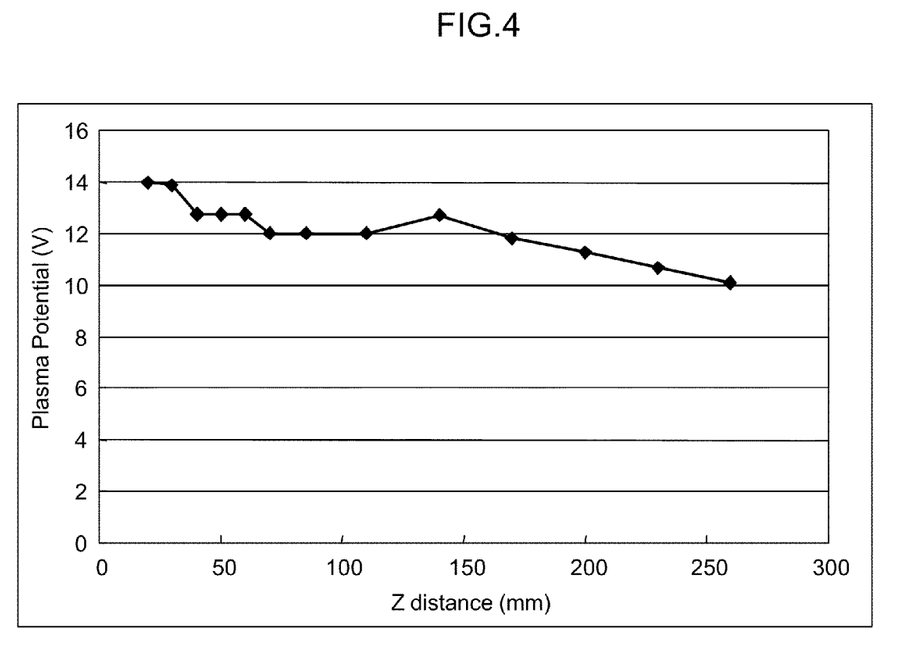
FIG. 4 is a graph showing results of measuring the floating potential Vp at a distance Z from the dielectric window.

FIG. 4 shows a graph of the results of measuring the plasma potential Vp at the distance Z from the dielectric window 22, similarly to the floating potential Vf described above.

As stated previously, the distance Z from the dielectric window 22 when carrying out plasma oxidation this time was 200 mm, and it can be seen that the plasma potential Vp in this case was approximately 11.5 V.

The substrate temperature should be from normal temperature to 400° C. and in this case it was set to 400° C.

Figure 5:
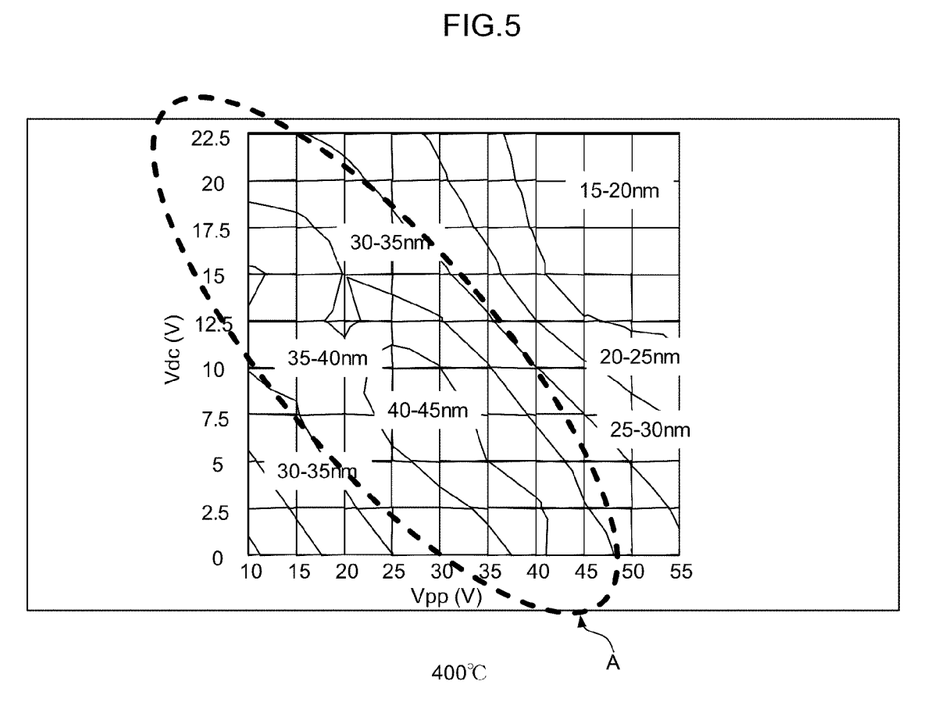
FIG. 5 is a graph showing measurement results of the oxide film thickness with respect to Vpp and Vdc when the substrate temperature is 400° C.

Under conditions of the substrate temperature of 400° C., distance from the dielectric window 22 of 200 mm, and gas pressure 50 mTorr, Vpp of the substrate bias potential was set to 15 to 50 V and Vdc was set to 0 to 25 V by adjusting the high-frequency output and the DC power source output, plasma oxidation was carried out, and the thickness of the oxidation film was measured.

FIG. 5 shows the measurement results of the oxidation film thickness with respect to these Vpp and Vdc values.

In FIG. 5, Vpp is plotted on the horizontal axis and Vdc is plotted on the vertical axis, and the oxide film thickness with respect to each peak-to-peak voltage Vpp and self-bias voltage Vdc is depicted in respective colors for a plurality of stages, depending on the film thickness.

In FIG. 5, the portion surrounded by the dotted frame A is a portion where the oxide film is thicker than the other portions. However, in this case, the range of optimal values of Vpp and Vdc is difficult to derive, and therefore the values of Vpp and Vdc are converted to the values of Vmax and Vmin.

Figure 6A:
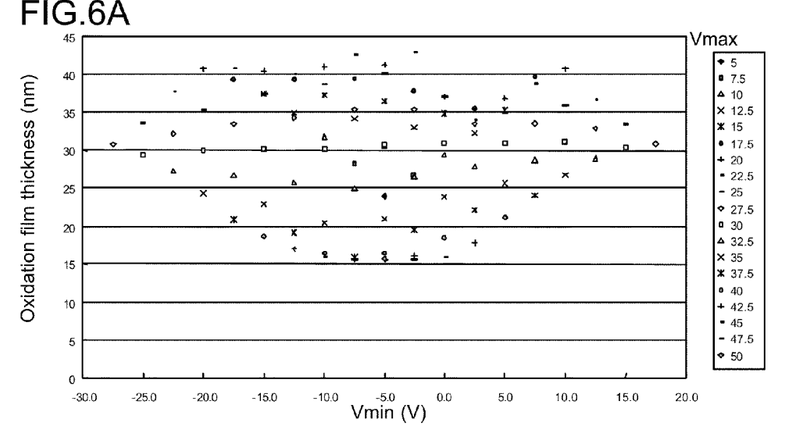
Figure 6B:
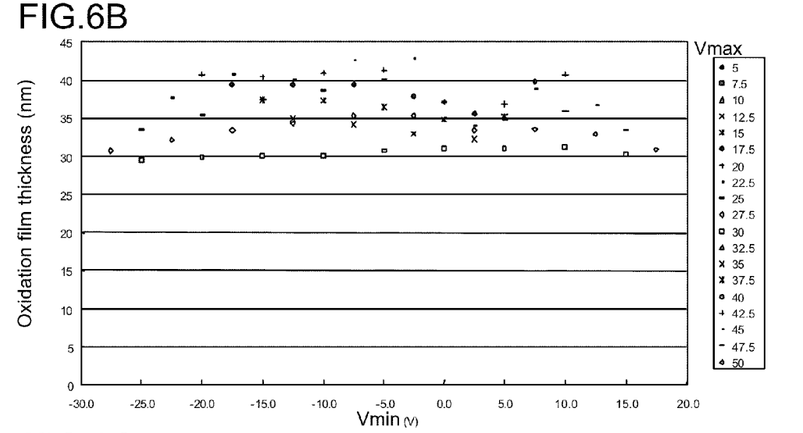
Figure 6C:
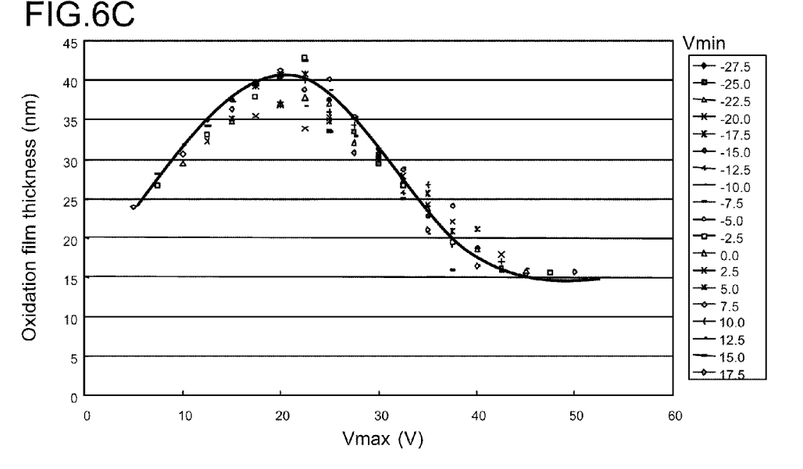

FIGS. 6A to 6C show the results of converting the values of Vpp and Vdc into the values of Vmax and Vmin. More specifically, FIGS. 6A to 6C show graphs plotting the measurement data of the oxide film thickness when plasma oxidation was carried out under the following conditions: Vmax=5 to 50 V and Vmin=−27.5 to 17.5 V.

FIGS. 6A and 6B show data corresponding to respective values of Vmax, plotting Vmin on the horizontal axis and the oxidation film thickness on the vertical axis, and FIG. 6C shows Vmax on the horizontal axis and the oxide film thickness on the vertical axis. Furthermore, FIG. 6A plots all of the measurement data for Vmax values from 5 to 50 in 2.5 increments, and FIG. 6B shows only the data for Vmax values from 11.5 to 30.

From FIGS. 6A and 6B, an optimal Vmin value for obtaining a thick oxide film thickness is not apparent. On the other hand, in FIG. 6C, it can be seen that a peak in the oxide film thickness is obtained when Vmax is in the range of 10 to 30 V.

Here, the peak of the oxide film thickness in plasma oxidation is when Vmax is equal to or greater than the plasma potential Vp and when Vp<Vmax<Vp+30 [V].

The fact that Vmax is equal to or greater than Vp means that, under the conditions of a positive bias being applied, negative ions are radiated onto the substrate 16. Furthermore, if Vmax is equal to or greater than Vp+30 [V], then the oxide film thickness has a low value, and this is inferred to be because reverse sputtering occurs due to oxygen ions or because the oxidation rate of the plasma oxidation declines due to the ignition of the plasma in the peripheral portion of the substrate, and so on.

Consequently, if the substrate temperature is 400° C., then Vmax is desirably controlled so as to satisfy Vp<Vmax<Vp+30 [V].

Figure 7:
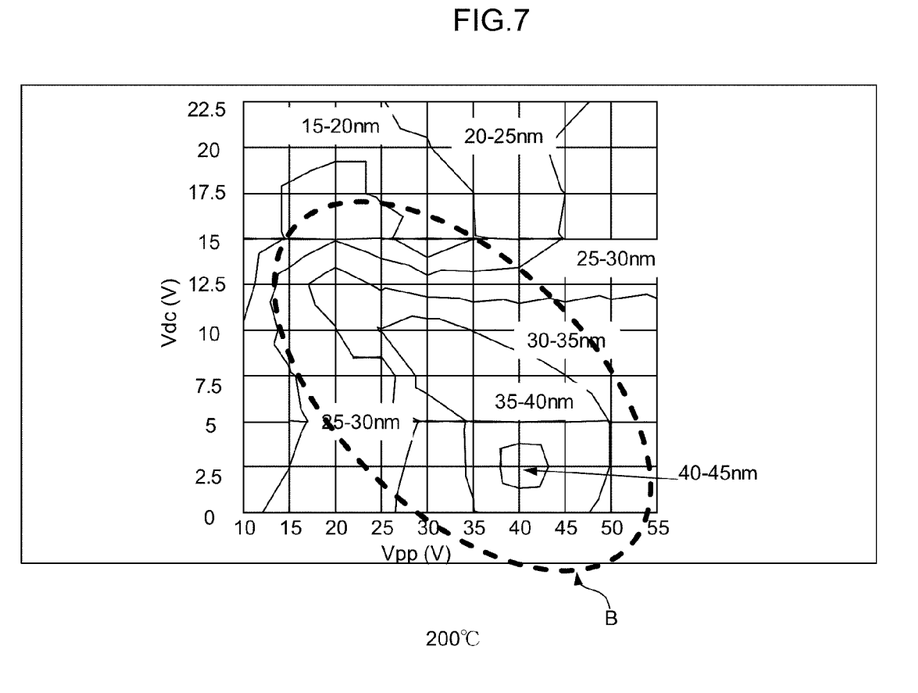
FIG. 7 is a graph showing measurement results of the oxide film thickness with respect to Vpp and Vdc when the substrate temperature is 200° C.

Furthermore, under conditions of the substrate temperature of 200° C., distance from the dielectric window 22 of 200 mm, and gas pressure of 50 mTorr, Vpp of the substrate bias potential was set to 15 to 50 V and Vdc was set to 0 to 25 V by adjusting the high-frequency output and the DC power source output, plasma oxidation was carried out, and the thickness of the oxidation film was measured. FIG. 7 shows the corresponding measurement results of the oxidation film thickness.

In FIG. 7, Vpp is plotted on the horizontal axis and Vdc is plotted on the vertical axis, and similarly to FIG. 5, the oxide film thickness corresponding to the respective values of Vpp and Vdc is depicted in respective colors for a plurality of stages, depending on the film thickness. In FIG. 7, the portion surrounded by the dotted frame B is a portion where the oxide film is thicker than the other portions.

Figure 8A:
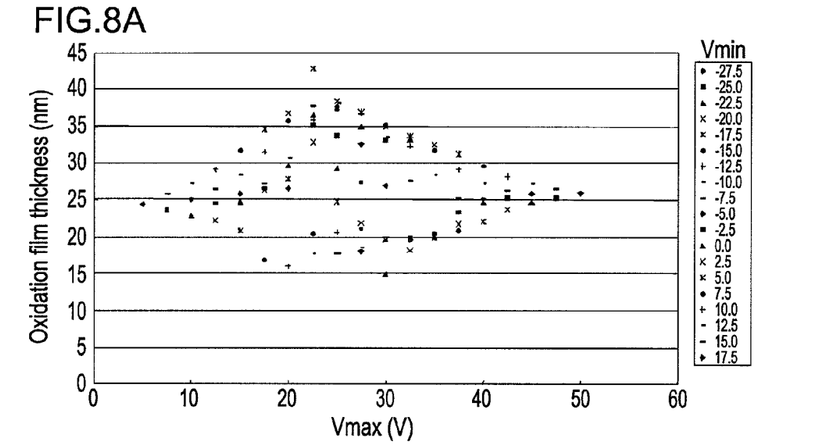
Figure 8B:
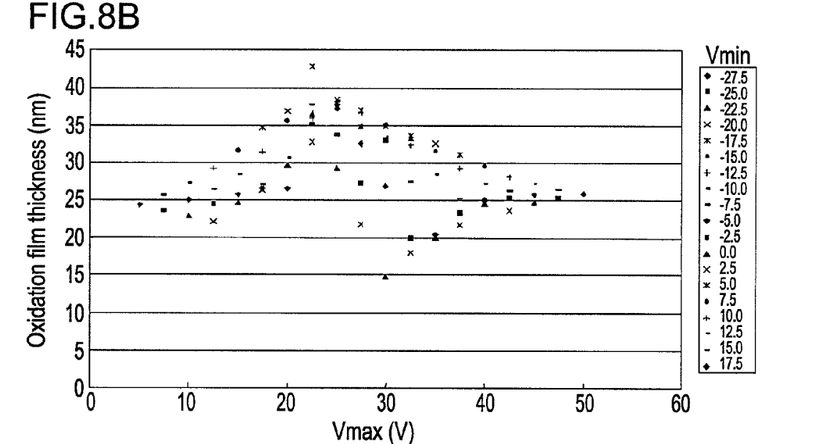
Figure 8C:
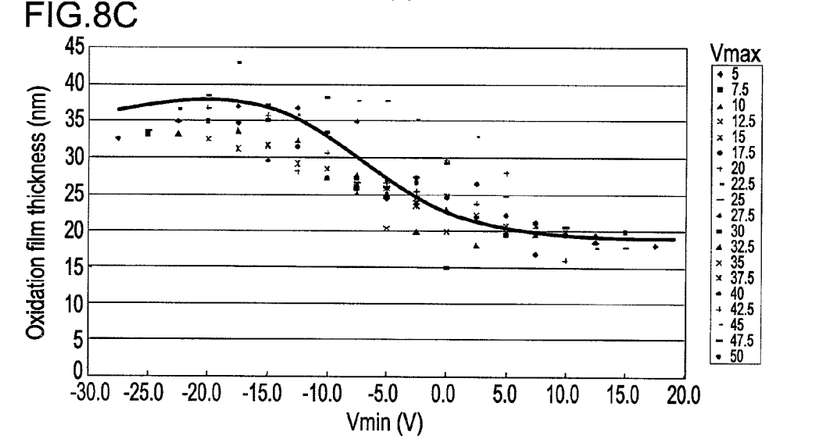

Furthermore, FIGS. 8A to 8C show the results of converting the values of Vpp and Vdc into the values of Vmax and Vmin. More specifically, FIGS. 8A to 8C show graphs plotting the measurement data of the oxide film thickness when plasma oxidation was carried out under the following conditions: Vmax=5 to 50 V and Vmin=−27.5 to 17.5 V.

FIGS. 8A and 8B show data corresponding to respective values of Vmin, plotting Vmax on the horizontal axis and the oxidation film thickness on the vertical axis, and FIG. 8C shows Vmin on the horizontal axis and the oxide film thickness on the vertical axis. Furthermore, FIG. 8A plots all of the measurement data for Vmin values from −27.5 to 17.5 in 2.5 increments, and FIG. 8B shows only the data for Vmin values of 5 or lower.

From FIGS. 8A and 8B, it can be seen that when the substrate temperature is 200° C., similarly to the foregoing, the peak of the oxidation film thickness produced by plasma oxidation occurs when Vmax is equal to or greater than the plasma potential Vp, and hence Vp<Vmax<Vp+30 [V] is satisfied.

Furthermore, from FIG. 8C which shows Vmin on the horizontal axis, it can be seen that the oxide film thickness becomes greater when Vmin becomes equal to or lower than Vp (11.5 V or lower). Moreover, the oxide film thickness becomes greater when Vmin is equal to or lower than 5 V. This indicates that since the plasma oxidation temperature is low, a certain amount of ion energy is required.

In this way, if the substrate temperature is 200° C., then Vmax should satisfy Vp<Vmax<Vp+30 [V], and Vmin<Vp<Vmax is satisfied. Moreover, Vmax<Vp+30 [V] and Vmin<Vp−5 [V] should be satisfied.

As described in detail above, according to the present embodiment, Vpp and Vdc can be controlled independently, the substrate bias potential applied satisfies Vmin<Vp<Vmax, and furthermore, Vmax<Vp+30 [V] and Vmin<Vp−5 [V] are satisfied. Therefore, it is possible to carry out the oxidation at low temperature and the oxidation rate can be improved. Furthermore, since the bias frequency is substantially 2 MHz, then it is possible to perform the oxidation at high speed and furthermore a thick film can be oxidized while producing little damage.

A plasma oxidation method and a plasma oxidation apparatus according to an embodiment of the present invention have been described in detail above, but the present invention is not limited to the aforementioned examples, and it is of course possible for improvements or modifications of various kinds to be implemented, within a range which does not deviate from the essence of the present invention.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A plasma oxidation method comprising the steps of:
   generating oxygen-containing plasma with a process gas containing oxygen;

applying a bias voltage to a substrate placed on a stage; and radiating positive ions and negative ions in the oxygen-containing plasma onto the substrate so as to perform plasma oxidation of the substrate while controlling a bias potential of the substrate in such a manner that a maximum value Vmax and a minimum value Vmin of the bias potential and a plasma potential Vp satisfy a following relationship:

Vmin<Vp<Vmax<Vp+30V, and further satisfy, when a temperature of the substrate is 200° C. or lower, the following relationship:

Vmin<Vp−5V.

2. The plasma oxidation method as defined in claim 1, wherein the bias voltage applied to the substrate is controlled by a high-frequency wave application device provided with the stage.

3. The plasma oxidation method as defined in claim 2, wherein the high-frequency wave application device applies a direct-current voltage and a high-frequency voltage by a transformer-coupling system.

4. The plasma oxidation method as defined in claim 1, wherein the stage is positioned in a region where a floating potential during the plasma oxidation of the substrate is equal to or greater than 0 V.

5. The plasma oxidation method as defined in claim 1, wherein the substrate oxidized by the plasma oxidation is made of silicon or aluminum.

6. A plasma oxidation apparatus comprising:

a plasma generating unit which generates oxygen-containing plasma;

a stage on which a substrate is placed; and a high-frequency wave application device which applies a bias voltage to the substrate on the stage, wherein the plasma oxidation apparatus performs plasma oxidation of the substrate while applying the bias voltage to the substrate, the plasma oxidation being performed by radiating positive ions and negative ions in the oxygen-containing plasma onto the substrate so as to perform the plasma oxidation of the substrate while controlling a bias potential of the substrate in such a manner that a maximum value Vmax and a minimum value Vmin of the bias potential and a plasma potential Vp satisfy a following relationship:

Vmin<Vp<Vmax<Vp+30V, and further satisfy, when a temperature of the substrate is 200° C. or lower, the following relationship:

Vmin<Vp−5V.

7. The plasma oxidation apparatus as defined in claim 6, wherein the high-frequency wave application device applies a direct-current voltage and a high-frequency voltage by a transformer-coupling system.

8. The plasma oxidation apparatus as defined in claim 6, wherein the stage is positioned in a region where a floating potential during the plasma oxidation of the substrate is equal to or greater than 0 V.

* * * * *